United States Patent
Gu et al.

(10) Patent No.: US 9,264,707 B2
(45) Date of Patent: Feb. 16, 2016

(54) MULTI-SYMBOL RUN-LENGTH CODING

(71) Applicant: Google Inc., Mountain View, CA (US)

(72) Inventors: Qunshan Gu, Hayward, CA (US); Wei Jia, San Jose, CA (US)

(73) Assignee: Google Inc., Mountain View, CA (US)

(*) Notice: Subject to any disclaimer, the term of this patent is extended or adjusted under 35 U.S.C. 154(b) by 446 days.

(21) Appl. No.: 13/758,342

(22) Filed: Feb. 4, 2013

(65) Prior Publication Data

US 2015/0256826 A1    Sep. 10, 2015

(51) Int. Cl.
*H04N 19/13* (2014.01)

(52) U.S. Cl.
CPC ............... *H04N 19/00121* (2013.01)

(58) Field of Classification Search
CPC ................ H04N 19/13; G06T 9/005
USPC ....................... 375/240.23; 382/246
See application file for complete search history.

(56) References Cited

U.S. PATENT DOCUMENTS

| 3,739,085 | A | * | 6/1973 | Rosen et al. | 341/51 |
| 5,402,123 | A | * | 3/1995 | Jung | 341/63 |
| 5,793,896 | A | * | 8/1998 | Golin | 382/246 |
| 5,991,451 | A | * | 11/1999 | Keith et al. | 382/246 |
| 6,009,203 | A | * | 12/1999 | Liu et al. | 382/233 |
| 6,668,094 | B1 | * | 12/2003 | Yoo et al. | 382/246 |
| 7,372,379 | B1 | * | 5/2008 | Jia et al. | 341/67 |
| 2012/0182163 | A1 | * | 7/2012 | Cho et al. | 341/87 |

FOREIGN PATENT DOCUMENTS

JP    06152978 A * 5/1994 ............. H04N 1/411

* cited by examiner

*Primary Examiner* — William C Vaughn, Jr.
*Assistant Examiner* — Jae N Noh
(74) *Attorney, Agent, or Firm* — Brake Hughes Bellermann LLP

(57) ABSTRACT

A method includes performing, by a microprocessor of a computing device, a coding to obtain a residual of a residual data block from an original data block. The method includes pre-defining a default order of symbols in the residual data block. The method includes re-ordering the symbols in the residual data block in an order other than the default order, such that a first set of most frequently used symbols are in a first location and a second set of least frequently used symbols are in a second location, producing a multi-symbol run-length code based on a group of symbols from the first set of most frequently used symbols, and detecting the second set of least frequently used symbols based on the multi-symbol run-length code.

20 Claims, 6 Drawing Sheets

MULTI-SYMBOL RUN-LENGTH CODING

TECHNICAL FIELD

The present disclosure relates to image and video compression coding.

BACKGROUND

In image or video compression coding, variable length coding and run-length coding are techniques used for codec designs, which can be employed to code information when there are long-runs with the same symbol. A short code word is assigned to the most frequently used symbols while a longer code word is used for the less frequently used symbols. The same symbol with a run-length is coded with the run-length, rather than code the same symbol many times. In this way, the bitstream representing the original information will be compressed.

However, such techniques may be less efficient when the symbols are distributed without long runs. In those cases, the variable-length coding ends up with coding a great deal of location information. In various coding schemes, spatial data coding may exhibit some properties such as short runs or very few code words. These properties have not been efficiently employed by existing entropy coders, such as variable-length coding and arithmetic coding. Accordingly, a need exists for systems, methods, and apparatus to address the shortfalls of present technology and to improve coding efficiency.

SUMMARY

In one implementation, a method includes performing, by a microprocessor of a computing device, a first coding to obtain a residual of a residual data block from an original data block. The method includes pre-defining, by the microprocessor, a default order of symbols in the residual data block, and re-ordering, by the microprocessor, the symbols in the residual data block in an order other than the default order, such that a first set of most frequently used symbols are in a first location and a second set of least frequently used symbols are in a second location. The method includes producing, by the microprocessor, a multi-symbol run-length code based on a group of symbols from the first set of most frequently used symbols, and detecting, by the microprocessor, the second set of least frequently used symbols based on the multi-symbol run-length code.

Other implementations of this aspect include corresponding systems, apparatus, and computer programs, configured to perform the actions of the methods, encoded on computer storage devices.

The details of one or more implementations are set forth in the accompanying drawings and the description below. Other features will be apparent from the description and drawings, and from the claims.

BRIEF DESCRIPTION OF THE DRAWINGS

FIG. 7 is a block diagram illustrating another example data block.

FIG. 8 is a block diagram illustrating a example coded block bitstream using the example data block of FIG. 7.

DETAILED DESCRIPTION

In accordance with aspects of the disclosure, a method and system is presented herein to improve image or video compression performance. The disclosed method provides a way to efficiently code a residual error signal. This disclosure describes, among other features, how: (1) a run-length is based on a group of symbols, rather than one particular symbol; and (2) a second group symbols are recognizable by the run-length of the first group and therefore these symbols can be coded using short code words that may be the same as the first group.

Figure 1:
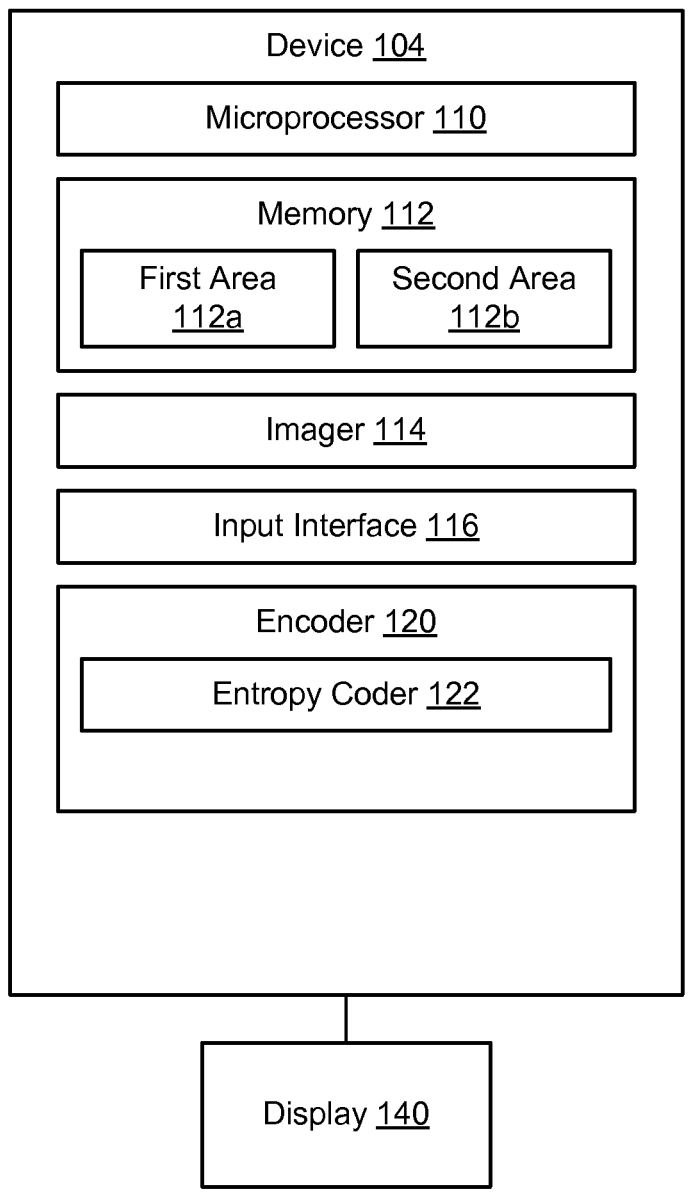
FIG. 1 is a block diagram illustrating an example system for multi-symbol run-length coding.

FIG. 1 is a block diagram illustrating an example system 100 for multi-symbol run-length coding, in accordance with aspects of the disclosure. In the example of FIG. 1, the system 100 includes a multi-symbol run-length coding system that may be associated with a device 104, thereby transforming the device 104 into a special purpose machine designed to implement multi-symbol run-length coding. In this sense, the device 104 may include various elements, including a microprocessor 110, a memory 112 such as a non-transitory computer-readable storage medium, power, peripherals, and various other elements not specifically shown in FIG. 1. The memory 112 may include one or more areas, such as a first area 112a and a second area 112b. The device 104 may include a display 140 (e.g., monitor or some other display) that may be used to display images (e.g., static images and/or video images). In some instances, various other elements of the device 104 that may be useful to implement the device 104 may be added or included, without departing from the scope of the present disclosure.

The system 100 may include an imager 114 configured to capture an image or images and generate uncompressed image data of the captured image or images. The imager 114 may be any device that converts an optical image into an electronic signal. In an example, the imager 114 may be a video camera configured to capture sequential images and generate uncompressed image data of the sequentially captured images. The imager 114 may include one or more sensors (e.g., any type of detector, such as a focal plane array) for capturing image signals representative of an image or images. The sensors of the imager 114 provide for representing or converting a captured image signal of an image or images as digital data (e.g., via an analog-to-digital converter included as part of the sensor or separate from the sensor as part of imaging system 100).

In an example, the imager 114 may include a static camera configured to capture a single static image and generate uncompressed image data of the captured image. In another example, the imager 114 may include a video camera configured to capture a plurality of sequential images and generate uncompressed image data of the sequentially captured images.

The system 100 may include an input interface 116 configured to receive image data from an external source including uncompressed image data. The input interface 116 may be configured to receive image data (e.g., static images or input video) streamed from another device. The input interface 116 may include one or more inputs for receiving image signals representative of an image or images. The one or more inputs of the input interface 116 may provide for receiving image signals of an image or images as digital data (e.g., via an analog-to-digital converter included as part of the input interface 116 or separate from the input interface 116 as part of the device 104).

The system 100 may include an encoder 120 configured to receive uncompressed image data and perform multi-symbol run-length coding of the uncompressed image data.

The encoder 120 may include an entropy coder 122 that is configured to code a residual error signal. The entropy coder 122 may assign a short code word to the most frequently used symbols, as discussed in more detail below with respect to FIGS. 2-5.

In an implementation of the device 104, the imager 114 may be configured to capture an image or images and generate uncompressed image data of the captured image or images. In this instance, the encoder 120 may be configured to receive the uncompressed image data from the imager 114 and store the uncompressed image data in the first area 112a of the memory 112. In an example, the imager 114 may include a static camera configured to capture a single static image and generate uncompressed image data of the captured image. In another example, the imager 114 may include a video camera configured to capture a plurality of sequential images and generate uncompressed image data of the sequentially captured images.

In an implementation of the device 104, the imager 114 may be configured to capture an image or images and generate uncompressed image data of the captured image or images. In this instance, the microprocessor 110 may be configured to receive the uncompressed image data from the imager 114 and provide the encoder 120 with the uncompressed image data.

In an implementation of the device 104, the input interface 116 may be configured to receive image data of image or images. In this instance, the encoder 120 may be configured to receive the image data from the input interface 116 and store the image data in the first area 112a of the memory 112.

The display 140 may display the uncompressed image data of the captured image. The display 140 may include an image display device (e.g., a liquid crystal display (LCD)) or some various other type of video display or monitor. The microprocessor 110 may be adapted to display image data on the display 140. The microprocessor 110 may be configured to retrieve and obtain image data from memory 112 and display any retrieved image data on the display 140. The display 140 may include display electronics, which may be utilized by the microprocessor 110 to display image data. The display 140 may receive image data directly from imager 114 via mircoprocessor 110, or the image data may be transferred from the memory 112 via the mircoprocessor 110.

In the example of FIG. 1, the system 100 is illustrated using various components. However, such illustration is provided for clarity and convenience, and thus, in some instances, the various components may overlap or be combined within a described block(s) or module(s), or may be implemented by one or more block(s) or module(s) not specifically illustrated in the example of FIG. 1.

Figure 2:
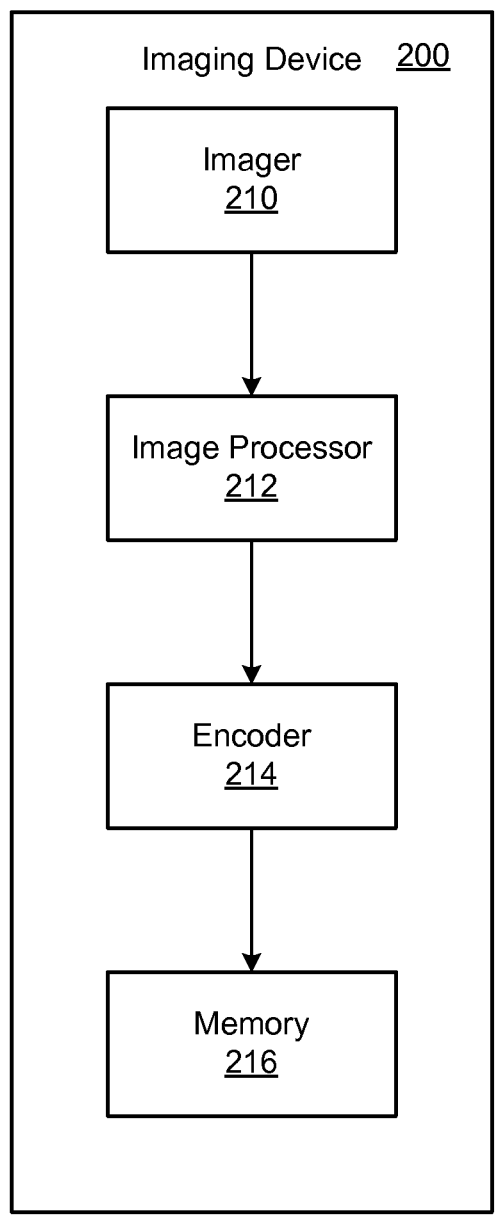
FIG. 2 is a block diagram illustrating an example imaging device for multi-symbol run-length coding.

FIG. 2 is a block diagram illustrating an example of an imaging device 200 for multi-symbol run-length coding, in accordance with aspects of the disclosure. As shown in FIG. 2, an imaging device 200 may include an imager 210, an image processor 212, an encoder 214, and a memory 216. In various implementations, the imaging device 200 may represent various mobile devices including mobile phones, smartphones, consumer video cameras (e.g., compact, DSLR-video, etc ,), security video cameras, or any device that records and stores video digitally.

The imager 210 may capture an image and generate uncompressed image data of the captured image. The imager 210 may be referred to as a camera sensor or an imaging sensor. The imager 210 may include a video imager that captures a plurality of sequential images and generate uncompressed image data of the sequentially captured images. In various examples, the imager 210 may capture one or more images and generate uncompressed image data of the captured images. The imager 210 may be any device that converts an optical image into an electronic signal. For instance, the imager 210 may be a video camera that captures a plurality of sequential images and generates uncompressed image data of the sequentially captured images.

An encoder 214 may receive the uncompressed image data directly from the imager 210, store an encoded bitstream of the uncompressed image data in a first memory area of the memory 216, and perform a multi-symbol run-length coding of the uncompressed image data.

In an implementation, referring to the example of FIG. 2, the image processor 212 may receive image signals from the imager 210, process the received image signals (e.g., to provide processed image data), and provide the image signals and/or the image data to the encoder 214.

Figure 3:
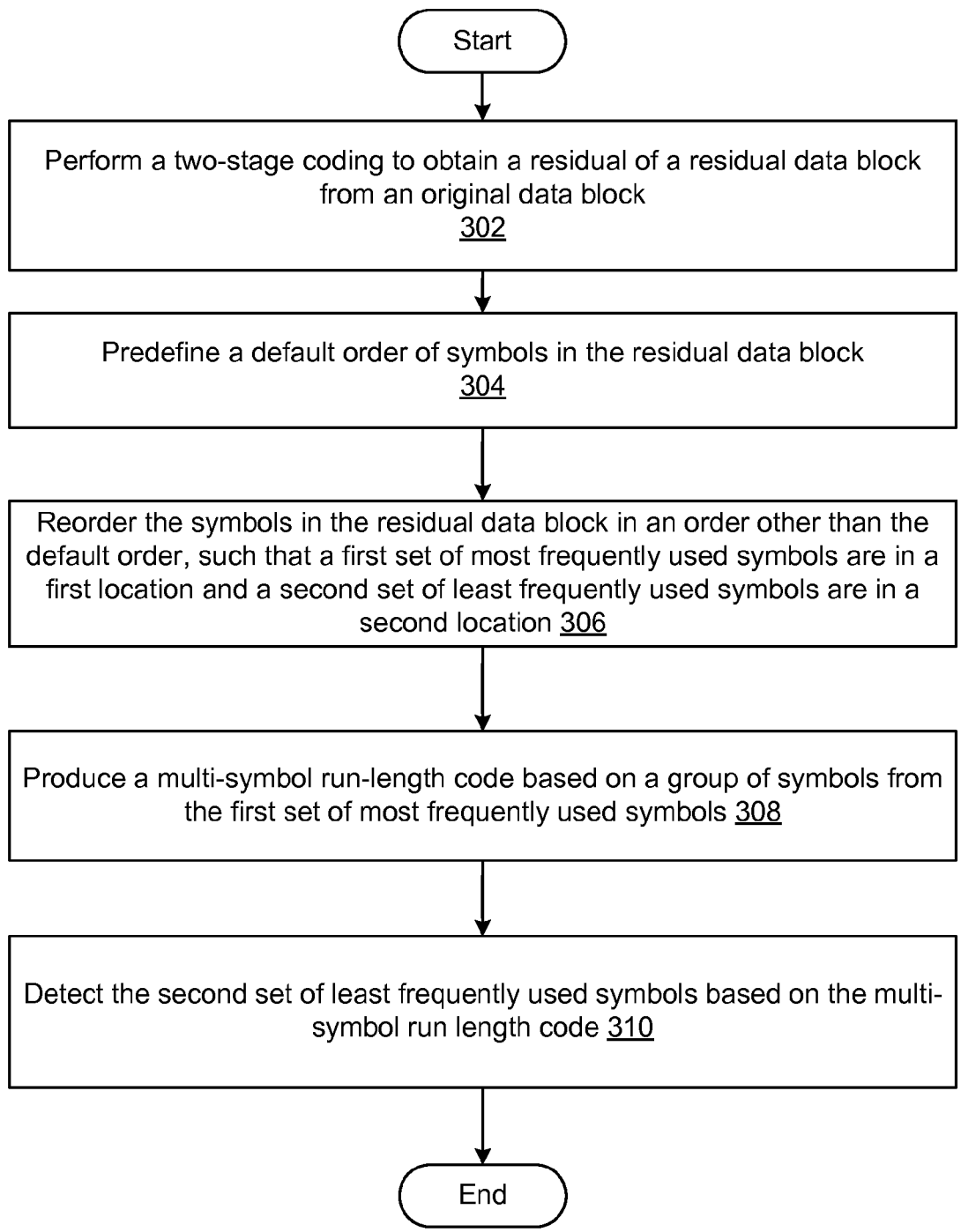
FIG. 3 is a flow diagram illustrating an example process that may be used for multi-symbol run-length coding.

FIG. 3 is a flow diagram illustrating an example process that may be used for multi-symbol run-length coding. The operations of FIG. 3 may be performed, for example, by imaging device 104 or system 100 as shown in FIG. 1.

As shown in FIG. 3, the system (for example, the microprocessor 110 shown in FIG. 1) performs a two-stage coding to obtain a residual of a residual data block from an original data block (302). The system predefines a default order of symbols in the residual data block (304). The system re-orders the symbols in the residual data block in an order other than the default order, such that a first set of most frequently used symbols are in a first location and a second set of least frequently used symbols are in a second location (306). The system produces a multi-symbol run-length code based on a group of symbols from the first set of most frequently used symbols, and detects the second set of least frequently used symbols based on the multi-symbol run-length code. Example implementations are discussed in more detail below, for example with respect to FIGS. 4 and 5.

An example implementation may be with a data matrix of dimension N×N. In this invention, this matrix is the residual error data in the spatial domain of a two-stage coding. It would exhibit the following properties: (1) Low energy (i.e., there only exists a few data elements with small values around "zero"); (2) There are more "zeros" than other data values; (3) For any given value, the run-length of the same value is very short. This description includes a method to efficiently code such a residual error signal.

The two-stage coding may include the following process. First, for an original data block Dblk, the system may conduct intra or inter prediction to get the first residual error data block R1. The system may perform transform, quantization and entropy coding of the Residual error data block R1. The system may perform inverse quantization, inverse transform to get the reconstructed residual data block RR1. The system may subtract RR1 from R1 to get the Residual of the residual block R2=R1−RR1, and then perform entropy coding of R2

Entropy Coding

As discussed above, the entropy coding may, as shown in FIG. 3 (at 304), pre-define a default order of the symbols, for example by: 0, 1, −1, 2, −2, ... N, −N, ....

In some implementations, a picture header, a slice header, a segment header, a macroblock header, or any block header, may include codes to modify the pre-defined default order of the symbols by a removal process or a re-order process. When a symbol is removed, the other remaining symbols may be automatically re-ordered in a way that some or all of the symbols behind the removed symbols will be pulled up. A re-order process may put a symbol into a specific location, other than the pre-defined location. The locations of other symbols between the current location and the previous location may be pushed down by one. The removal process and re-order process can be done based on analyzing the statistics of the residual error signals in the picture, slice, segment, macroblock or blocks. More frequently used symbols may be pulled ahead in the order so that a shorter code word may be employed for the encoding.

The system may divide the symbols into two distinct groups. In this example, the first group consists the first three symbols, while the second group consists the other symbols. The system may pre-define the variable length code of the first three symbols by: 0, 10, 11.

The system may pre-define the other symbols by variable length code: 0, 10, 110, 1110, ... etc. The number of symbols in a block is limited, and the last variable length code can use all "1"s for the last symbol. For example, if there is a total of five symbols, the other two symbols in the second group can be represented by "0" and "1"; if there are six symbols, the other three symbols in the second group can be represented by 0, 10, 11; if there are seven symbols, the other four symbols can be represented by 0, 10, 110, 111. The maximum number of symbols in a block can be defined in different headers ranging from the picture header to the block header.

In some implementations, symbol removal, re-order and the indication of the maximum number of symbol may consume overhead bits. In some implementations, the system may employ these processes in a higher layer syntax such as a slice or a segment. It may also be worthwhile to employ these processes for a large block of data.

Run-Length Code

The run-length code can use a fixed length-code or variable length code. If the run-length code is a fixed length code, then a system may define the maximum length that the run-length code can run. The maximum length can be defined in the picture header, slice header, segment header, macroblock header, or block header. Alternatively or additionally, the maximum length can also be inferred by a default word-length. For example, if the maximum run-length of the first three symbols is L, the system can use a fixed-length word of int(log 2(L))+1 to represent the run-length, where int(x) is the integer of x with truncation. If a shorter word-length is chosen (i.e. the system can not guarantee that the run-length of the first group would be less than the maximum value of the code word), then a code word can be established that can indicate whether to continue or terminate the run with the pre-defined first group of symbols (the first three in this example), or the next symbol would belong to the second group. For example, if the code word-length is 4, the maximum run-length is 14. A code word "1110" would mean the run is 14 and the next symbol belong to the second group, while "1111" would mean the run is 14 and the next symbol still belongs to the first group. This allows the use of shorter code word to represent the second group symbols.

Bitstream Syntax Fields

The bitstream syntax of the entropy coding may be organized as follows.

Header definition:
Run-length code word-length indication: 2-bit
00: 3-bit (0-7)
01: 4-bit (0-15)
10: 5-bit (0-31)
11: 6-bit (0-63)
Run-Continuation Flag: 1-bit
0: The run-length code is enough to cover the maximum run-length and all run-length code represents the real run-length. At the end of the run of the first group, at least one symbol in the second group would exist.
1: The run-length code is not enough to cover all maximum run-length. When maximum value of the run-length code (all 1s), would represent a continuation of the second largest value. For example, if the run-length code word is 4-bit, then "1111" would represent a run-length of 14 (instead of 15) with a continuation run with the same first group. "1110" would represent a run-length of 14 with a stop-run, i.e. the next symbol belongs to the second group.
Number of Symbols: 3-bit
000: 1 symbol
001: 2 symbols
010: 3 symbols
011: 4 Symbols
100: 5 Symbols
101: 6 symbols
110: 7 symbols
111: 8 or more symbols
Symbol-Removal Operation: 2+V-bit
00: No Symbol removal
01: One symbol is removed, a fixed or variable length field follows, which represents the index of the removed symbol
10: Two symbols are removed, two fixed or variable length fields follow, which represent the indexes of the removed symbols
11: Three symbols are removed, three fixed or variable length fields follow, which represent the indexes of the removed symbols
Symbol re-order Operations: 2+V-bit
00: No Symbol re-order
01: One symbol is re-ordered, one pair of fixed or variable length fields follow, which represent the indexes of before and after re-order for the re-ordered symbol
10: Two symbols are re-ordered, two pairs of fixed or variable length fields follow, which represent the indexes of before and after for the re-ordered symbols
11: Three symbols are re-ordered, three pairs of fixed or variable length fields follow, which represent the indexes of before and after for the re-ordered symbols.

These fields may or may not exist depending on the layers, block sizes and the trade-off of the coding efficiency. For a particular design, it may only make sense to have some field exist in some level but not the others.

Scan Order

The scanning order can be zigzag scan or raster scan or any scan method. This can be chosen based on other criteria or simply a fixed scan method.

Block Size

The block size can be chosen based on optimization or convenience or simply a fixed block size.

Figure 4:
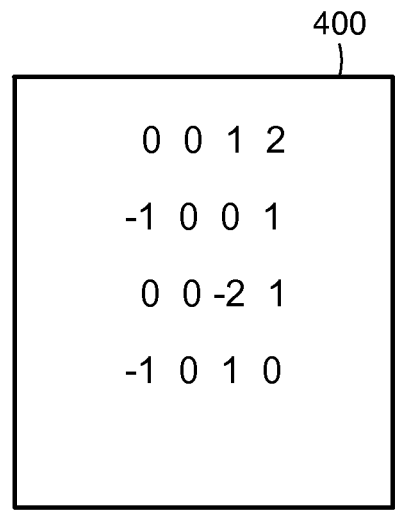
FIG. 4 is a block diagram illustrating an example data block.
Figure 5:
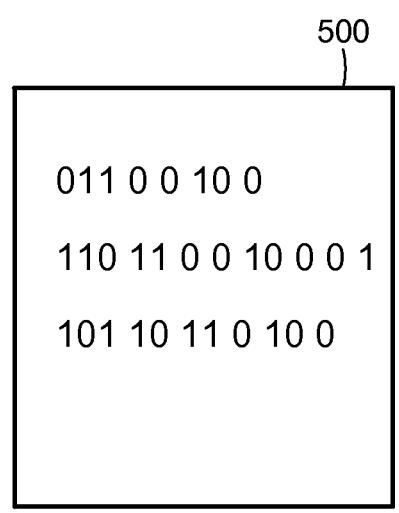
FIG. 5 is a block diagram illustrating an example coded block bitstream.

FIG. 4 is a block diagram illustrating an example data block. As shown in FIG. 4, a data block 400 may include a 4×4 block of data, which may be encoded using systems and methods described here (for example using entropy coder 122) so as to appear, for example, as shown in FIG. 5. In this example implementation, a block size is 4×4 and a scan order is raster scan.

In this example, the following fields are in the picture, slice, or segment header:

Run-length code word-length indication: 00 (indicating a 3-bit fixed word-field for run-length)

Run-Continuation Flag: 1 (indicating that '111' would be a continuation run of 6)

Number of Symbols: 100 (indicating there are a max of 5 symbols, therefore the first group of three symbols would be coded as 0, 10, and 11; while the second group of two symbols would be coded as 0 and 1)

Symbol-Removal Operation: 00 (indicating there is no symbol removal)

Symbol re-order Operations: 00 (indicating that there is no symbol re-order operation).

FIG. 5 is a block diagram illustrating an example coded block bitstream. Using a left to right and top to bottom raster-scan of the data block 400 shown in FIG. 4, a coded block bitstream 500 would look as shown in FIG. 5. In such an example, the bitstream 500 costs a total of 31 bits or average of 1.9375-bit per data.

Accordingly, using systems and methods described here, the run-length is based on a group of symbols, rather than one particular symbol, and the second group symbols are recognizable by the run-length of the first group, therefore, these symbols can be coded using short code words that may be the same as the first group.

FIG. 7 is a block diagram illustrating another example data block. As shown in FIG. 7, a data block 700 may include a 6×6 block of data, which may be encoded using system and methods described here (for example using entropy coder 122) so as to appear, for example, as shown in FIG. 8. In this example, the data block includes 6 values. Values 0, 1, and −1 occur most frequently and may be in a first group and assigned the variable length codes of 0, 10, and 11, respectively, as explained above with regard to Entropy Coding. Values 2, −2, and 3 are the other symbols and may be in a second group and assigned 0, 10, and 11, as explained above with regard to Entropy Coding. The following fields may be in the picture, slice or segment header: Run-length code word indication: 01 (indicating a 4-bit fixed word-field for run-length); Run-Continuation Flag: 1 (indicating that '1111' would be a continuation of a run of 14); and Number of Symbols: 101 indicating a maximum of six symbols). Thus, as indicated above, the first three symbols are coded as 0, 10, and 11 and the second three as 0, 10, and 11.

FIG. 8 is a block diagram illustrating an example coded block bitstream using the example data block of FIG. 7. Because the Run-length code word indication is 01, the first four bits of each line of FIG. 8 are the run length of the symbols in the first group in that line. As illustrated in FIG. 7, the run length of symbols in the first group is 3 (e.g., 0, 0, 1 from the first line of FIG. 7), which is encoded in 4 bits as "0011". Thus, the next three values, namely "0, 0, and 10" represent variable length codes for values in the first group. After the run of the values in the first group, the next value, "11" represents a variable length code for symbols in the second group (e.g., the 3 in the first row of FIG. 7). The next symbol in FIG. 7 is a 0, which is in the first group and starts another run of values in the first group. The run is 18 symbols long (e.g., spanning the end of the first row to the 4$^{th}$ row of block 700). Because 18 is larger than the code-word length, the run-length in the second line of FIG. 8 is "1111". As indicated above, this indicates a run of 14 symbols (rather than 15) but the next symbol still belongs to the first group. Thus, as shown in the example of FIG. 8, the system will determine that the last two variable length codes correspond to the first group (e.g., the symbols 0 and −1) rather than the second group. Line 3 of FIG. 8 includes the variable length codes for the remaining two symbols from the run of 18 symbols, thus the run-length in the third line is "0010" or 2. The next variable length code is determined to be from the second group (e.g., −2 from the fourth line of block 700). The next run of symbols from the first group is 8, so line 4 of block 800 has a run-length of 1000 (e.g., binary 8). Therefore the first 8 variable length codes represent symbols from the first group and the remaining two variable length codes represent symbols from the second group. The last line of block 800 represents the remaining run of three symbols from the first group that remain in block 700.

Figure 6:
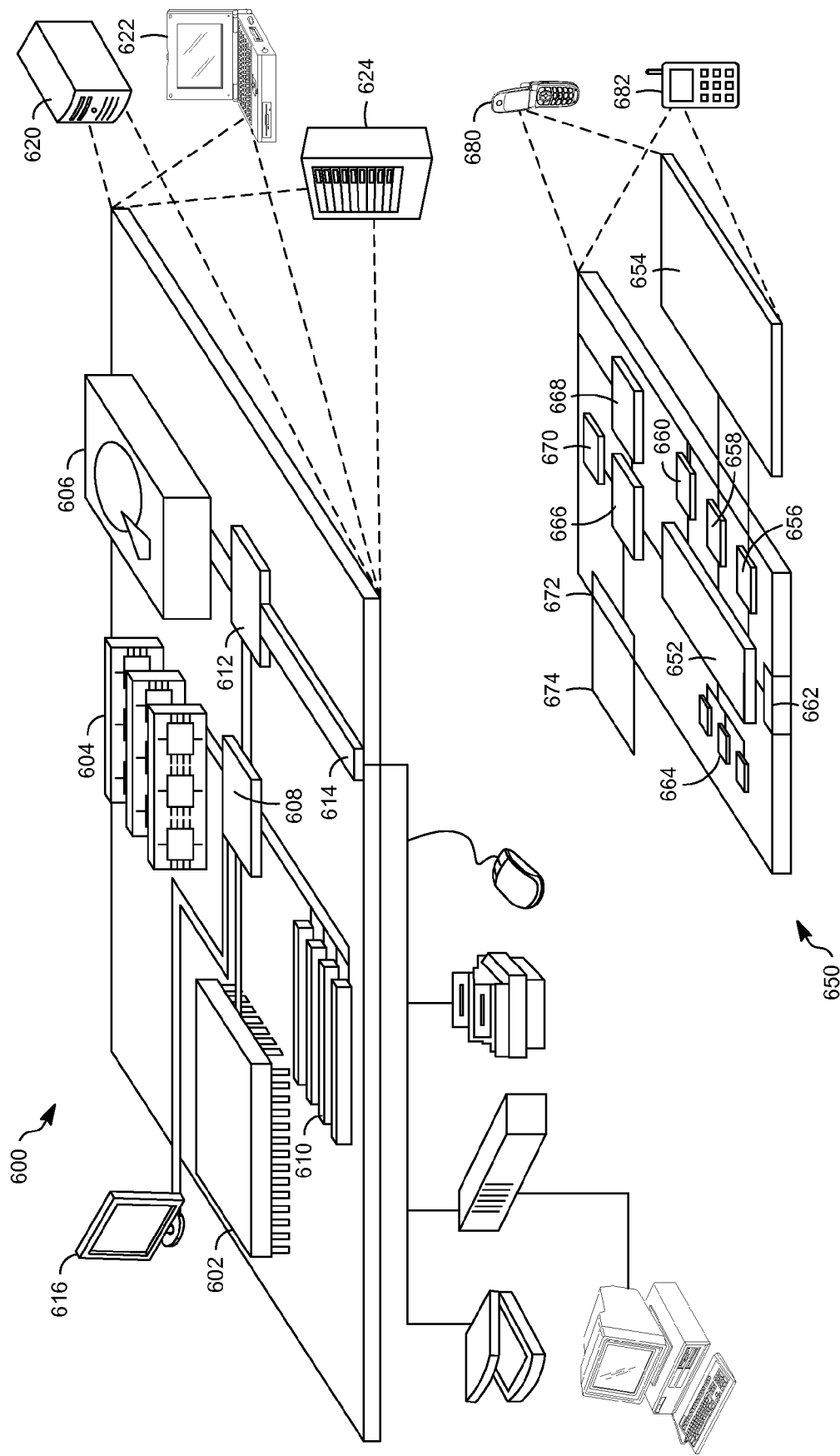
FIG. 6 is a block diagram illustrating example or representative computing devices and associated elements that may be used to implement one or more systems and methods of FIGS. 1-5, in accordance with aspects of the disclosure.

FIG. 6 is a block diagram illustrating example or representative computing devices and associated elements that may be used to implement one or more systems and methods of FIGS. 1-5, 7 and 8, in accordance with aspects of the disclosure.

In an implementation, FIG. 6 shows an example of a computer device 600 and a mobile computer device 650 (e.g., mobile communication device including a low-power mobile communication device, such as, for example, mobile phone, cellular phone, etc.), which may be used in accordance with aspects, methods, and techniques, as described and provided herein. The computing device 600 may represent various forms of digital computers, such as personal computers, laptops, tablets, desktops, workstations, personal digital assistants, servers, blade servers, mainframes, and other appropriate computers. The computing device 650 may represent various forms of mobile devices, such as personal digital assistants, cellular telephones, smart phones, and other similar computing devices. The components shown herein, their connections and relationships, and their functions, are meant to be exemplary only, and are not meant to limit implementations described herein and/or claimed in this disclosure.

The computing device 600 may include one or more processors 602, memory 604, a storage device 606, a high-speed interface 608 connecting to memory 604 and high-speed expansion ports 610, and a low speed interface 612 connecting to low speed bus 614 and storage device 606. One or more of the components 602, 604, 606, 608, 610, and 612, are interconnected using various busses, and may be mounted on a common motherboard or in other manners as appropriate. In an implementation, the processor 602 may be configured to process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be utilized, as appropriate, along with multiple memories and types of memory. Further, multiple computing devices 600 may be connected, with the device providing portions of the necessary operations (e.g., as a server bank, a group of blade servers, or a multi-processor system).

The memory 604 may be configured to store information within the computing device 600. In an implementation, the memory 604 may comprise one or more volatile memory units. In another implementation, the memory 604 may comprise one or more non-volatile memory units. The memory 604 may comprise another form of non-transitory computer-readable medium, such as a magnetic or optical disk.

The storage device 606 may be configured for providing mass storage for the computing device 600. In an implementation, the storage device 606 may comprise a non-transitory computer-readable medium, such as a floppy disk device, a hard disk device, an optical disk device, or a tape device, a flash memory, or other similar solid state memory device, or an array of devices, including devices configured for use in a storage area network or various other configurations. In some implementations, a computer program product may be tangibly embodied in an information carrier. The computer program product may include instructions that, when executed, perform one or more methods, such as those described herein. In another implementation, the information carrier may comprise a non-transitory computer-readable medium or a non-transitory machine-readable medium, such as the memory 604, the storage device 606, or memory on the processor 602.

The high speed controller 608 may be configured to manage bandwidth-intensive operations for the computing device 600, while the low speed controller 612 may be configured to manage lower bandwidth-intensive operations. Such allocation of functions may be exemplary only. In an implementation, the high-speed controller 608 may be coupled to the memory 604, the display 616 (e.g., through a graphics processor or accelerator), and/or to the high-speed expansion ports 610, which may be configured to accept various expansion cards (not shown). In the implementation, low-speed controller 612 may be coupled to the storage device 606 and/or the low-speed expansion port 614, wherein the low-speed expansion port, which may include various communication ports (e.g., USB, BLUETOOTH, ETHERNET, wireless ETHERNET, etc.) may be coupled to one or more input/output devices, such as a keyboard, a pointing device, a scanner, or a networking device, such as a switch or router, e.g., through a network adapter.

The computing device 600 may be implemented in a number of different forms, in a manner as shown in FIG. 6. For example, the computing device 600 may be implemented as a standard server 620, or multiple times in a group of such servers. The computing device 600 may be implemented as part of a rack server system 624. In addition, the computing device 600 may be implemented in a personal computer (PC), such as a laptop computer 622. In another implementation, components from the computing device 600 may be combined with other components in a mobile device (not shown), such as device 650. One or more of such devices may include one or more of computing devices 600, 650, and an entire system may be made up of multiple computing devices 600, 650 communicating with one another.

The computing device 650 may include one or more processors 652, memory 664, an input/output device, such as a display 654, a communication interface 666, and a transceiver 668, among various other components. The device 650 may be provided with a storage device, such as a micro-drive or some other related device, to provide additional storage. One or more of the components 650, 652, 664, 654, 666, and 668 may be interconnected using various buses, and several of the components may be mounted on a common motherboard or in other manners as appropriate.

The processor 652 may be configured to execute instructions within the computing device 650, including instructions stored in the memory 664. The processor 652 may be implemented as a chipset of chips that include separate and multiple analog and digital processors. In an implementation, the processor 652 may provide for coordination of the other components of the device 650, such as control of user interfaces, applications run by device 650, and wireless communication by device 650.

The processor 652 may be configured to communicate with a user through a control interface 658 and a display interface 656 coupled to a display 654. The display 654 may comprise, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In an implementation, an external interface 662 may be provided in communication with the processor 652 to enable near area communication of device 650 with various other devices. In an example, the external interface 662 may provide for wired communication in some implementations, or for wireless communication in other implementations, and multiple interfaces may be utilized.

The memory 664 may be configured to store information within the computing device 650. The memory 664 may be implemented as one or more of a non-transitory computer-readable medium or media, one or more volatile memory units, or one or more non-volatile memory units. Expansion memory 674 may be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, in an example, expansion memory 674 may include instructions to carry out or supplement the processes described above, and may include secure information. Thus, for example, the expansion memory 674 may be provided as a security module for device 650, and may be programmed with instructions that permit secure use of device 650. Further, secure applications may be provided via the SIMM cards, along with additional information, such as placing identifying information on the SIMM card in a secure manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652 that may be received, for example, over transceiver 668 or external interface 662.

The device 650 may be configured to communicate wirelessly through communication interface 666, which may include digital signal processing circuitry where necessary. In an implementation, a communication interface 666 may provide for communications under various modes or protocols, such as GSM voice calls, SMS, EMS, or MMS messaging, CDMA, TDMA, PDC, WCDMA, CDMA2000, or GPRS, among others. In an example, such communication may occur, for example, through a radio-frequency transceiver 668. Further, short-range communication may occur, such as using a Bluetooth, WiFi, or other such transceiver (not shown). Still further, a GPS (Global Positioning System) receiver module 670 may provide additional navigation- and/or location-related wireless data to device 650, which may be used as appropriate by applications running on device 650.

The device 650 may be configured to communicate audibly using audio codec 660, which may receive spoken information from a user and convert it to usable digital information. In an example, an audio codec 660 may likewise generate audible sound for a user, such as through a speaker, e.g., in a handset of the device 650. In various implementations, such sound may include sound from voice telephone calls, may include recorded sound (e.g., voice messages, music files, etc.) and may include sound generated by applications operating on the device 650.

The computing device 650 may be implemented in a number of different forms, in a manner as shown in FIG. 6. For example, the computing device 650 may be implemented as a mobile communication device 680 including a cellular telephone and/or some other low power mobile communication devices. In another example, the computing device 650 may be implemented as part of a smart phone 682, personal digital assistant, or some other similar mobile device.

As such, various implementations of the systems, methods, and techniques described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and may be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a non-transitory machine-readable medium that is configured to receive machine instructions as a machine-readable signal. In various examples, the term "machine-readable signal" may refer to any signal used to provide machine instructions and/or data to a programmable processor.

In an implementation, to provide for interaction with a user, the systems, methods, and techniques described herein may be implemented on a computer having a display device (e.g., a CRT (cathode ray tube) or LCD (liquid crystal display) monitor) for displaying information to the user and a keyboard and a pointing device (e.g., a mouse or a trackball) by which the user may provide input to the computer. Other types of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

In various examples, the systems, methods, and techniques as described herein may be implemented in a computing system that includes a back end component (e.g., as a data server), or that includes a middleware component (e.g., an application server), or that includes a front end component (e.g., a client computer having a graphical user interface or a web browser through which a user may interact with an implementation of the systems, methods, and techniques described here), or any combination of such back end, middleware, or front end components. The components of the system may be interconnected by any form or medium of digital data communication (e.g., a communication network). Examples of communication networks include a local area network ("LAN"), a wide area network ("WAN"), and the Internet.

The computing system may include clients and servers. A client and server are generally remote from one another and typically interact through a communication network. The relationship of client and server arises by virtue of computer programs running on the respective computers and having a client-server relationship to one another.

The above embodiments that have been described in particular detail are merely example or possible embodiments, and that there are many other combinations, additions, or alternatives that may be included.

The particular naming of the components, capitalization of terms, the attributes, data structures, or any other programming or structural aspect is not mandatory or significant, and the mechanisms that may be used to implement aspects of the disclosure or its features may have different names, formats, or protocols. Further, the system may be implemented via a combination of hardware and software, as described, or entirely in hardware elements. Further, any particular division of functionality between the various system components described herein is merely exemplary, and not mandatory; functions performed by a single system component may instead be performed by multiple components, and functions performed by multiple components may instead performed by a single component.

Further, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
   performing, by a microprocessor of a computing device, a first coding to obtain a residual of a residual data block from an original data block;
   pre-defining, by the microprocessor, a default order of symbols in the residual data block;
   re-ordering, by the microprocessor, the symbols in the residual data block in an order other than the default order, such that a first set of most frequently used symbols are in a first location and a second set of least frequently used symbols are in a second location;
   assigning each symbol in the first set a variable length code;
   assigning each symbol in the second set a variable length code, wherein at least a first symbol in the first set has the same code as a second symbol in the second set; and
   encoding the residual data block with a multi-symbol run-length code, wherein the run length applies to a run of symbols in the first set and symbols in the second set lack a corresponding run-length code.

2. The method of claim 1, further comprising:
   determining a maximum quantity of symbols in data block; and
   encoding the maximum quantity in a header, wherein the codes assigned to symbols in the second set are determined based on the maximum quantity.

3. The method of claim 1, wherein the first coding includes:
   conducting, for the original data block, intra or inter prediction to obtain a first residual error data block;
   performing transform, quantization, and entropy coding of the residual error data block;
   performing inverse quantization and inverse transform to obtain a reconstructed residual data block; and subtracting the reconstructed residual data block from the residual error data block to obtain the residual data block.

4. The method of claim 1, wherein determining the maximum quantity of symbols includes:
analyzing statistics of residual error signals in a picture header, a slice header, a segment header, a macroblock header, or a block header of the original data block; and
based on the analyzing, determining a frequency of each symbol in the residual data block.

5. The method of claim 1, wherein the multi-symbol run-length code is a fixed length code with a defined maximum length, wherein a code from the second set follows the end of a run of codes for the first set.

6. The method of claim 5, further comprising:
inferring the defined maximum length from a default word length.

7. The method of claim 5, further comprising:
generating the defined maximum length in a picture header, a slice a header, a segment header, a macroblock header, or a block header.

8. The method of claim 1, wherein a maximum value for the multi-symbol run-length code is smaller than a maximum run-length of symbols in the first set.

9. The method of claim 8, wherein the multi-symbol run-length code includes a value that indicates whether codes following the run correspond to symbols from the first set or from the second set.

10. The method of claim 1, further comprising:
recognizing the second set of least frequently used symbols based on the multi-symbol run-length code.

11. The method of claim 9, wherein when the multi-symbol run-length code has a highest value, codes following the run correspond to symbols from the first set.

12. The method of claim 1, wherein the first set of symbols includes three symbols and the second set includes remaining symbols.

13. A computer system comprising:
a memory; and
an encoder configured to perform a first coding to obtain a residual of a residual data block from an original data block, the encoder including an entropy coder configured to:
pre-define a default order of symbols in the residual data block;
re-order the symbols in the residual data block in an order other than the default order, such that a first set of most frequently used symbols are in a first location and a second set of least frequently used symbols are a second location;
assign each symbol in the first set a variable length code;
assign each symbol in the second set a variable length code, wherein at least a first symbol in the first set has the same code as a second symbol in the second set; and
encode the residual data block with a multi-symbol run-length code, wherein the run length applies to a run of symbols in the first set and symbols in the second set lack a corresponding run-length code.

14. The system of claim 13, wherein the first coding includes:
conducting, for the original data block, intra or inter prediction to obtain a first residual error data block;
performing transform, quantization, and entropy coding of the residual error data block;
performing inverse quantization and inverse transform to obtain a reconstructed residual data block; and
subtracting the reconstructed residual data block from the residual error data block to obtain the residual data block.

15. The system of claim 13, the entropy coder further configured to:
analyze statistics of residual error signals in a picture header, a slice header, a segment header, a macroblock header, or a block header of the original data block to determine a frequency of each symbol in the residual data block.

16. The system of claim 13, wherein the run-length code is a fixed length code with a defined maximum length.

17. The system of claim 13, wherein a maximum value for the run-length code is smaller than a maximum run-length of symbols in the first set.

18. The system of claim 17, wherein the multi-symbol run-length code includes a value that indicates whether codes following the run correspond to symbols from the first set or from the second set.

19. The system of claim 18, wherein when the multi-symbol run-length code has a highest value, codes following the run correspond to symbols from the first set.

20. A non-transitory computer readable medium containing instructions that when executed by a microprocessor of a computer system cause the system to:
perform a coding to obtain a residual of a residual data block from an original data block, the original data block associated with image data;
pre-define a default order of symbols in the residual data block;
re-order the symbols in the residual data block in an order other than the default order, such that a first set of most frequently used symbols are in a first location and a second set of least frequently used symbols are in a second location;
assign each symbol in the first set a variable length code;
assign each symbol in the second set a variable length code, wherein at least a first symbol in the first set has the same code as a second symbol in the second set; and
encode the residual data block with a multi-symbol run-length code, wherein the run length applies to a run of symbols in the first set and symbols in the second set lack a corresponding run-length code.

\* \* \* \* \*

UNITED STATES PATENT AND TRADEMARK OFFICE
CERTIFICATE OF CORRECTION

PATENT NO. : 9,264,707 B2  
APPLICATION NO. : 13/758342  
DATED : February 16, 2016  
INVENTOR(S) : Qunshan Gu et al.

Page 1 of 1

It is certified that error appears in the above-identified patent and that said Letters Patent is hereby corrected as shown below:

In the Claims

In column 13, line 20, in claim 7, delete "a header," and insert --header,--, therefor.

Signed and Sealed this
Twenty-fourth Day of May, 2016

Michelle K. Lee
*Director of the United States Patent and Trademark Office*